(12) United States Patent
Sudo (10) Patent No.: US 7,569,888 B2
(45) Date of Patent: Aug. 4, 2009

(54) SEMICONDUCTOR DEVICE WITH CLOSE STRESS LINER FILM AND METHOD OF MANUFACTURING THE SAME

(75) Inventor: Gaku Sudo, Fishkill, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 568 days.

(21) Appl. No.: 11/200,168

(22) Filed: Aug. 10, 2005

(65) Prior Publication Data
US 2007/0034963 A1 Feb. 15, 2007

(51) Int. Cl.
*H01L 27/092* (2006.01)
(52) U.S. Cl. .............................. 257/369; 257/E21.632
(58) Field of Classification Search ................ 257/369, 257/347, 59, 351, 69, 499, E21.632, E27.084
See application file for complete search history.

(56) References Cited

U.S. PATENT DOCUMENTS

| | | | |
|---|---|---|---|
| 7,279,746 B2 * | 10/2007 | Doris et al. ................. | 257/338 |
| 2005/0051851 A1 * | 3/2005 | Chen et al. .................. | 257/369 |
| 2005/0266639 A1 * | 12/2005 | Frohberg et al. ............ | 438/257 |
| 2006/0043484 A1 * | 3/2006 | Cabral et al. ................ | 257/347 |
| 2006/0091471 A1 * | 5/2006 | Frohberg et al. ............ | 257/369 |
| 2006/0102955 A1 * | 5/2006 | Chen et al. .................. | 257/349 |
| 2006/0189056 A1 * | 8/2006 | Ko et al. ..................... | 438/197 |
| 2006/0199326 A1 * | 9/2006 | Zhu et al. .................... | 438/201 |
| 2008/0105862 A1 * | 5/2008 | Lung et al. .................. | 257/4 |
| 2008/0150024 A1 * | 6/2008 | Surdeanu et al. ........... | 257/347 |

OTHER PUBLICATIONS

Transmeta Efficeon™ TM880020ES Processor—Power Analysis, Chipworks, pp. 4-6, 4-47, and 4-49, Oct. 12, 2004.
T. Ghani, et al., "A 90nm High Volume Manufacturing Logic Technology Featuring Novel 45nm Gate Length Strained Silicon CMOS Transistors", IEEE, 2003.
A. Shimizu, et al., "Local Mechanical-Stress Control (LMC): A New Technique for CMOS-Performance Enhancement", IEEE, 2001.
H.S. Yang, et al., "Dual Stress Liner for High Performance sub-45nm Gate Length SOI CMOS Manufacturing", IEEE, 2004.

* cited by examiner

*Primary Examiner*—Nathan W Ha
(74) *Attorney, Agent, or Firm*—Banner & Witcoff, Ltd.

(57) ABSTRACT

Aspects of the present disclosure are generally directed to FETs with stress liners that are closer than typical stressed FETs, as well as methods for manufacturing the same. FETE channel sidewall spacers may be removed, or substantially reduced in width, prior to forming the stress liners. This may be performed without destroying the underlying thin oxide layer. The sidewall spacers may be removed substantially reduced either prior to or after silicide formation. Where the sidewall spacers are removed prior to silicide formation, a relatively thin oxide layer on opposing sides of the channel may be used as a mask when forming the silicide. In addition, devices having both an NFET with a closer-than-typical tensile liner and a PFET with a closer-than-typical compressive liner, as well as methods for manufacturing the same, are disclosed.

20 Claims, 11 Drawing Sheets

SEMICONDUCTOR DEVICE WITH CLOSE STRESS LINER FILM AND METHOD OF MANUFACTURING THE SAME

BACKGROUND

Field-effect transistors (FETs) are commonly manufactured in a silicon layer and covered by stress liners that apply either tensile or compressive stress to the channels of the FETs. The purpose of these stress liners has been to improve the mobility in the channels. The type of stress that is applied depends upon the type of FET. Compressive stress is applied to the channel of a P-channel FET (PFET) and tensile stress is applied to the channel of an N-channel FET (NFET).

Such stressed FETs are also manufactured with thick sidewall spacers disposed on opposing sides of the channel. The sidewall spacers are used for aligning the source and drain at a distance from the opposing sides of the channel. This is done by implanting the source and drain from a direction normal to the surface of the silicon layer, using the sidewall spacers as masks.

Silicide regions are also located away from the channel so that reduce junction leakage and parasitic resistance are reduced. To make the manufacturing process more efficient and to position the silicide regions to laterally coincide with the source/drain locations, the same sidewall spacers are also used for locating the silicide regions.

After the sidewall spacers are built and used as masks, the stress liner is added over the entire FET structure including the sidewall spacers. As a result, the stress liner is spaced laterally away from the channel on each side by at least the distance of one of the sidewall spacers.

SUMMARY

Unfortunately, distancing of the stress liner from the channel is inefficient because it reduces the effectiveness of the stress liner. It is desirable to position the stress liner as close as possible to the channel in order to apply additional stress to the channel.

Accordingly, aspects of the present disclosure are generally directed to FETs with stress liners that are closer than typical stressed FETs, as well as methods for manufacturing the same.

Further aspects of the present disclosure are directed to removing or substantially reducing FET channel sidewall spacers prior to forming the stress liners. This is performed without destroying the underlying thin oxide layer.

Still further aspects of the present disclosure are directed to removing or substantially reducing FET channel sidewall spacers either prior to or after silicide formation. Where the sidewall spacers are removed prior to silicide formation, a relatively thin oxide layer on opposing sides of the channel may be used as a mask when forming the silicide.

Yet further aspects of the present disclosure are directed to devices having both an NFET with a closer-than-typical tensile liner and a PFET with a closer-than-typical compressive liner, as well as methods for manufacturing the same.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

Figure 1A:
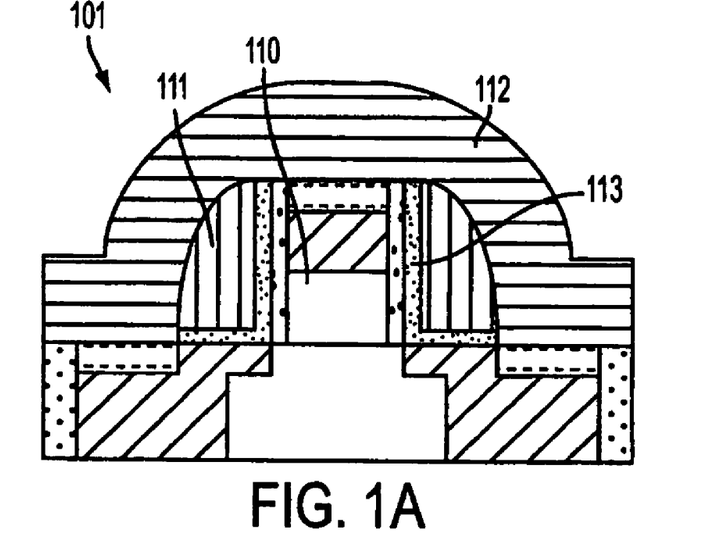
FIG. 1 is a cross-sectional view of two illustrative versions of a FET, where one has SiN sidewall spacers between the gate sidewall and the stress liner, and the other does not.
Figure 1B:
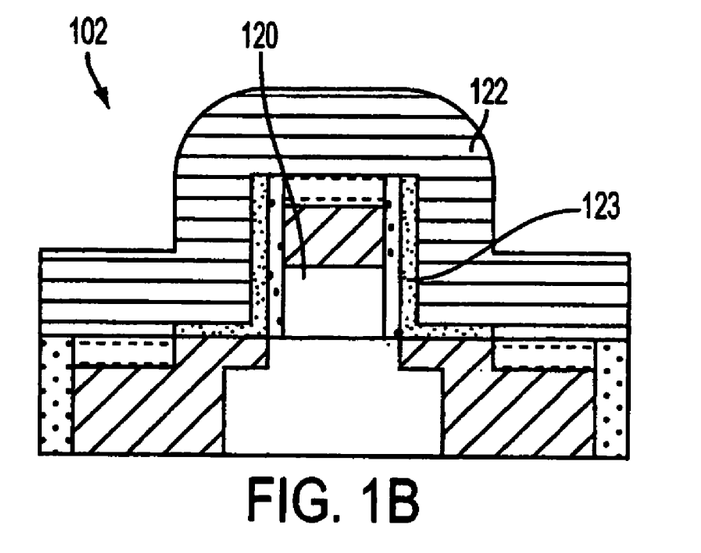

Referring to FIG. 1, a conventional FET 101 is shown with 50 nm wide silicon nitride (SiN) sidewall spacers 111 between the sidewalls of a channel 110 and a stress liner 112. FIG. 1 also shows a non-conventional FET 102 without the sidewall spacers next to a channel 120. This allows a stress liner 122 to be closer to channel 120, and in this example it allows stress liner 122 to run approximately parallel with the sidewalls of channel 120 along their entire lengths (whereas stress liner 112 does not run parallel with the sidewalls of channel 110). Both FETs 101, 102 may be an NFET or a PFET. The result is that, all other factors being equal, the channel 120 of FET 102 is subject to greater stress than the channel 110 of FET 101. Therefore, greater mobility is achieved in the channel 120 of FET 102 than in the channel 110 of FET 101. In fact, by removing sidewall spacers 111, a performance increase of ten percent or more may be realized. In contrast, previous manufacturers have attempted to reduce the horizontal (x direction) thickness of sidewall spacers 111 by up to 20 nanometers (nm), along with a corresponding reduction in the horizontal length of underlying oxide layer 113 (thus resulting in 30 nm wide sidewall spacers). However, these attempts have, at best, resulted in a five percent performance increase. Also, reducing both sidewall spacers 111 and oxide layer 113 horizontally in conventional devices results in the source/drain regions and the silicide implantation being closer to gate 110 than may be desirable, thus reducing potential performance gains due to increased junction leakage and parasitic resistance.

FET 102 is shown with a thin oxide layer 123. Oxide layer 123 may be thinner than an oxide layer 113 in FET 101. Although FET 102 is shown as having a total lack of any SiN sidewall spacers, a FET may be manufactured having SiN sidewall spacers that are smaller in width than typical SiN sidewall spacers such as sidewall spacers 111, as will be discussed further below.

Figure 2:
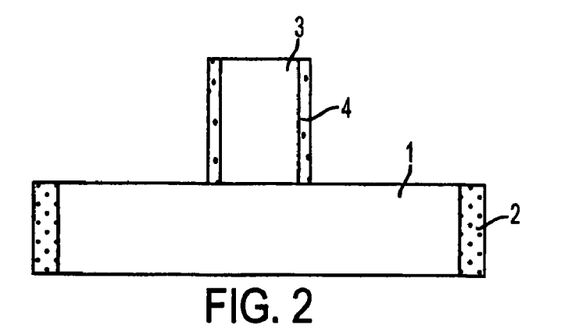
FIGS. 2-5 are cross-sectional views showing illustrative early steps that may be taken in the manufacture of a FET.

FIGS. 2-5 show illustrative early steps that may be taken toward the manufacture of either an NFET or a PFET using either a compressive or tensile stress liner. Referring to FIG. 2, a gate dielectric layer (not shown) and a polysilicon gate 3 are formed on a conventional silicon-on-insulator (SOI) wafer. SOI wafer includes silicon body 1 and shallow-trench isolation (STI) region 2. After re-oxidation of the gate sidewalls (not shown), a first offset spacer 4 is formed on the gate opposing sidewalls. First offset spacer 4 may be, for example, an oxide layer.

Figure 3:
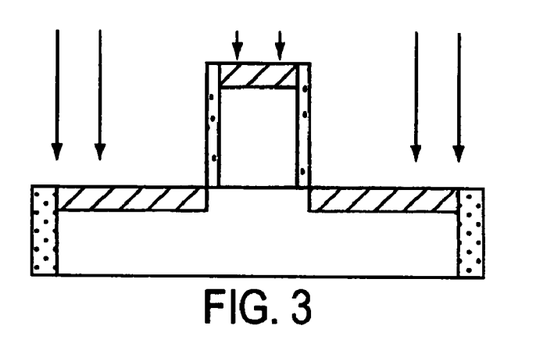

Next, referring to FIG. 3, extension and halo implantation are performed on the FET.

Figure 4:
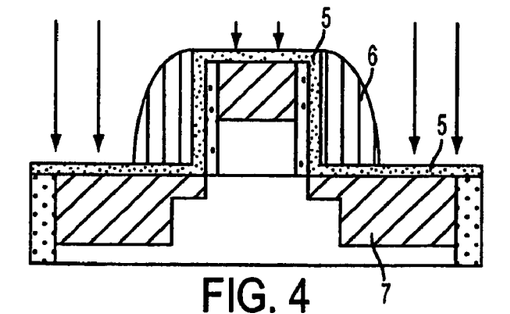

Next, referring to FIG. 4, an L-shaped oxide layer 5 is formed over silicon body 1 and the opposing sidewalls of gate 3. Oxide layer 5 may be, for example, about 50 angstroms thick. A sidewall spacer 6 is then formed on first offset spacer 4 and oxide layer 5 at each of opposing sides of gate 3. Sidewall spacer 6 may be of any width, such as about 50 nm in width at its widest portion, or more. Sidewall spacer may be made of, for example, SiN or boron-doped silicon glass. After sidewall spacer formation, deep source/drain implantation is performed, as indicated by regions 7.

Figure 5:
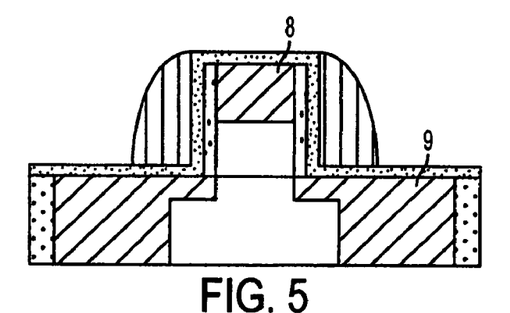

Next, referring to FIG. 5, activation anneal is performed. Also, gate 3 is well-doped, resulting in doped region 8, while simultaneously final source/drain regions 9 are formed.

The next several steps in the manufacture of the FET may be performed in varying ways. Two examples are provided.

Figure 6:
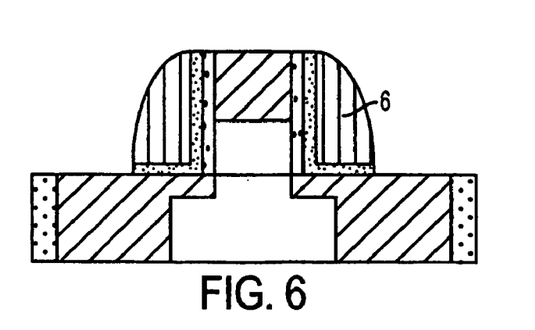
FIGS. 6-9 are cross-sectional views showing illustrative later steps that may be taken in the manufacture of a FET, where SiN sidewall spacers are removed prior to silicide formation.

The first example, shown in FIGS. 6-9, addresses the situation where sidewall spacers 6 are removed prior to silicide formation. Referring to FIG. 6, which occurs following activation anneal, exposed portions of oxide layer 5 are partially or completely removed using sidewall spacers 6 as a mask, resulting in the shown configuration. This may be done by performing a wet etching process. For example, a hydrogen fluoride (HF) 90 angstrom wet etch or reverse sputtering may be performed to partially remove the exposed portions of oxide layer 5, such that up to only about 10 angstroms in thickness of exposed oxide layer remains. The reason that it may be desirable to leave such a tiny amount of oxide is that a full 100 angstrom etch at this point in the process may laterally reduce oxide layer 5 underneath sidewall spacers 6 by an undesirably large amount. Thus, in this example a multi-step etch process was used to remove the exposed portions of oxide layer 5: first, a 90 angstrom etch, and later, a 10 angstrom etch. Of course, other combinations of etching amounts may be performed as appropriate, depending upon the thickness of oxide layer 5 and/or other considerations. After etching oxide layer 5, the etch solution is then cleaned off in preparation for the next step.

Figure 7:
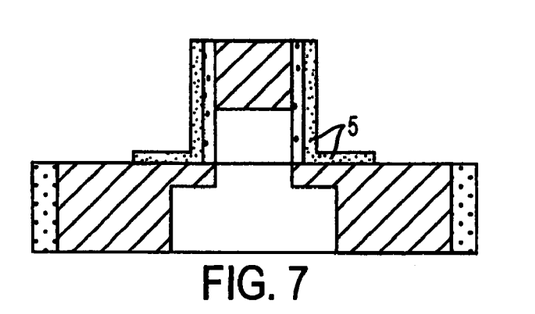

Next, referring to FIG. 7, sidewall spacers 6 are completely removed using reactive ion etching (RIE) or a wet etching process. For example, where sidewall spacers 6 are made of SiN, a hot phosphoric 500 angstrom wet etch may be used, which may reduce or even avoid silicon erosion that would otherwise be caused by RIE. Or, where sidewall spacers 6 are made of boron-doped silicon glass, they may be removed using vapor HF etching. The etch solution is then cleaned off in preparation for the next step. Then, another HF 10 angstrom wet etch may be performed to remove any remaining thin portions of oxide layer 5 (silicide pre-cleaning). Although in this example sidewall spacers 6 are completely removed, it may be desirable that a portion of sidewall spacers 6 remains. The amount of sidewall spacers 6 that remains, if any, may be adjusted by the amount of etching applied. A side effect of this second etching step is that the thicker portions of oxide layer 5 (i.e., the portions that were previously masked by sidewall spacers 6) are reduced from about fifty angstroms in thickness to about twenty-five angstroms in thickness.

Figure 8:
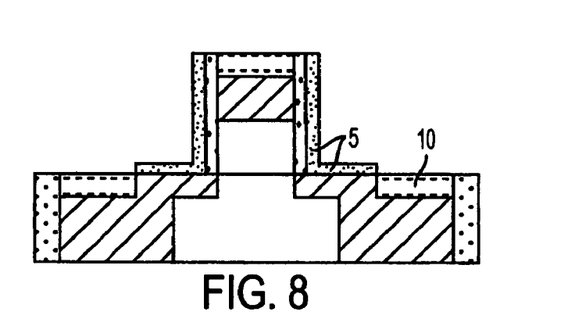

Next, referring to FIG. 8, nickel silicide 10 is formed, such as by nickel sputtering, on top of gate 3 and source/drain regions 9 using oxide layer 5 as a mask. Also, as an alternative to the 10 angstrom wet etch, SC1 cleaning may be used after silicide formation to remove any remaining undesired oxide layer 5.

Figure 9:
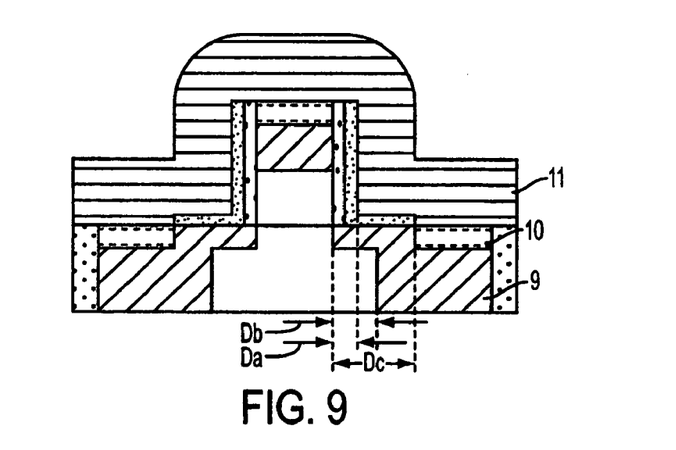

Next, referring to FIG. 9, a SiN stress liner 11 is deposited over the entire FET area. If the FET is a PFET, then stress liner 11 may be a compressive stress liner. If the FET is an NFET, then stress liner 11 may be a tensile stress liner. As can be seen in FIG. 9, since sidewall 6 no longer exists, stress liner 11 is able to be disposed much more closely to gate 3, resulting in a more effective stress liner. In fact, stress liner 11 is laterally closer to gate 3 (by distance Da) than source/drain regions 9 (which is a distance Db from gate 3) and silicide layer 10 (which is a distance Dc from gate 3). For example, stress liner 11 may be laterally closer by 10 nm or more than source/drain regions 9 and/or silicide layer 10. In other words, Dc-Da and/or Db-Da may be 10 nm or more.

Figure 10:
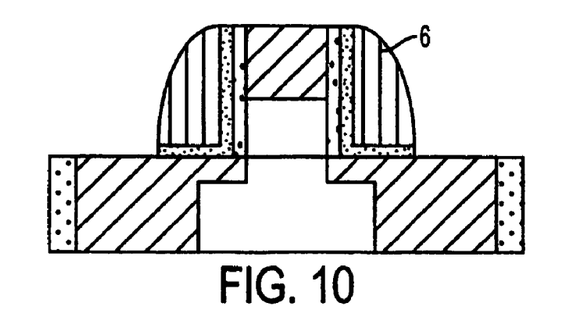
FIGS. 10-13 are cross-sectional views showing illustrative later steps that may be taken in the manufacture of a FET, where SiN sidewall spacers are removed after silicide formation.

The second example of manufacturing steps that may occur after the steps shown in FIGS. 2-5 are shown in FIGS. 10-13. This example addresses the situation where sidewall spacers 6 are removed after silicide formation. Referring to FIG. 10, following activation anneal, exposed portions of oxide layer 5 are removed using sidewall spacers 6 as a mask, resulting in the shown configuration. Oxide layer 5 may be removed by a wet etching process. For example, a hydrogen fluoride (HF) 100 angstrom wet etch or reverse sputtering may be performed to fully remove the exposed portions of oxide layer 5 in a single etching step instead of the multi-step etching described previously in connection with FIG. 6. Thus, oxide removal and silicide pre-cleaning are performed simultaneously. The etch solution is then cleaned off in preparation for the next step.

Figure 11:
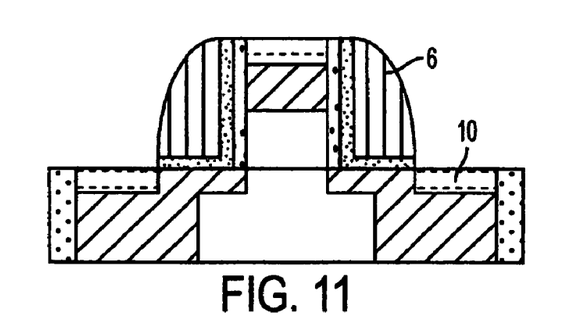

Next, referring to FIG. 11, nickel silicide 10 is formed, such as by nickel sputtering, on top of gate 3 and source/drain regions 9 using sidewall spacers 6 as a mask.

Figure 12:
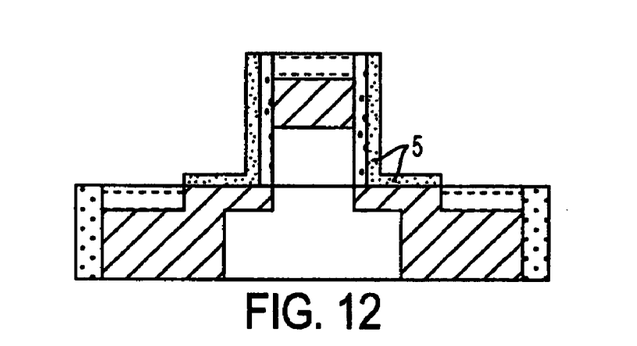

Next, referring to FIG. 12, sidewall spacers 6 are removed using reactive ion etching (RIE). RIE etching is appropriate in this situation since silicide 10 mostly protects silicon body 1 from erosion. Or, where sidewall spacers 6 are made of SiN, a hot phosphoric 500 angstrom wet etch may be used, which may reduce or even avoid silicon erosion that would otherwise be caused by RIE. As another possibility, where sidewall spacers 6 are made of boron-doped silicon glass, they may be removed using vapor HF etching. Although in this example sidewall spacers 6 are completely removed, it may be desirable that a portion of sidewall spacers 6 remains. The amount of sidewall spacers 6 that remains, if any, may be adjusted by the amount of etching applied.

Figure 13:
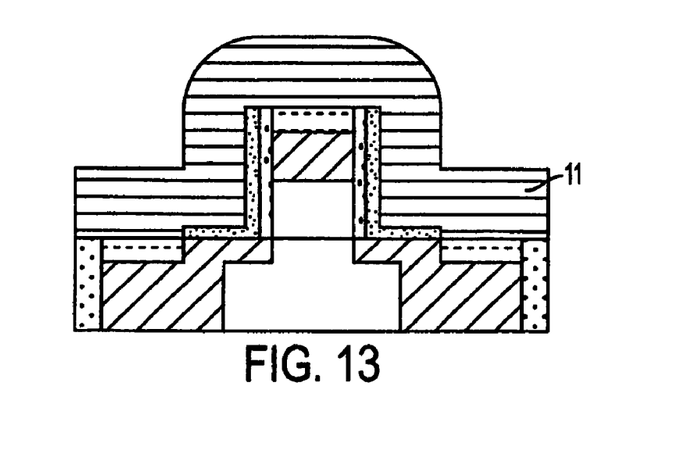

Next, referring to FIG. 13, a SiN stress liner 11 is deposited over the entire FET area. If the FET is a PFET, then stress liner 11 may be a compressive stress liner. If the FET is an NFET, then stress liner 11 may be a tensile stress liner. As can be seen in FIG. 13, since sidewall 6 no longer exists, stress liner 11 is able to be disposed much more closely to gate 3, resulting in a more effective stress liner.

Figure 20:
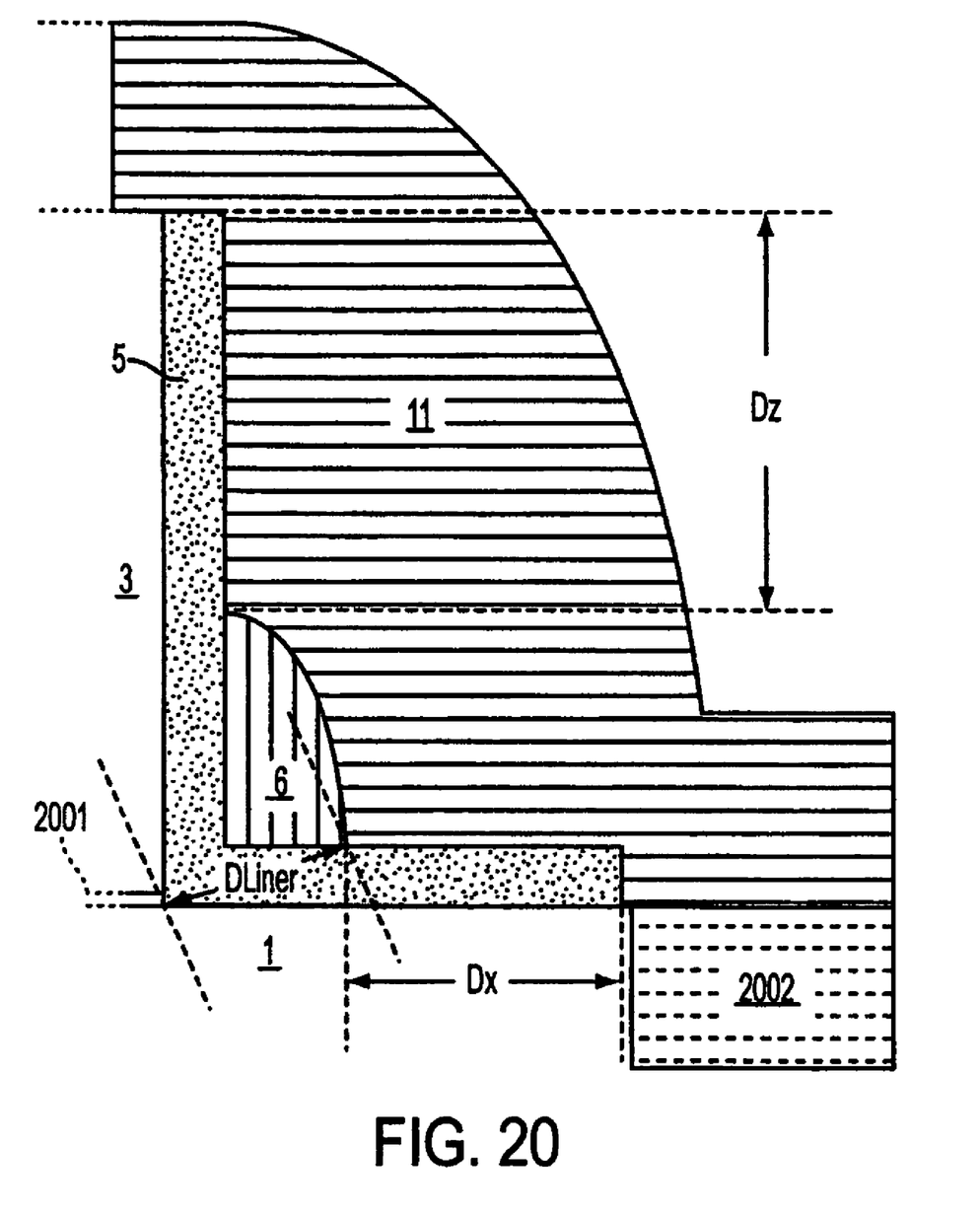
FIG. 20 is a cross-sectional view of an illustrative oxide layer with reduced sidewall spacer.

As previously mentioned, either the entirety of sidewall spacer 6 may be removed, or else only a sufficient portion may be removed. FIG. 20 shows an illustrative close-up cross section of the latter situation. In this case, a portion of sidewall spacer 6 remains disposed on oxide layer 5. However, upon being partially removed, sidewall spacer 6 no longer extends to the vertical and horizontal boundaries of oxide layer 5. Instead, there is a distance in the z direction, Dz, as well as a distance in the x direction, Dx, over which oxide layer 5 has no disposed sidewall spacer 6. Those portions measured by Dx and Dz may be directly in contact with stress liner 11. Dx and Dz may be any non-zero distance. For example, Dx and/or Dz may be at least 1 nanometer (nm). More generally, Dx (i.e., the portion between gate 3 and silicide layer 2002 that is not covered by sidewall spacer 6) may be, for instance, at least three percent, or at least fifty percent, or even at least ninety percent, of the total x-direction length of oxide layer 5. In addition, the region, if any, between the outer edge of oxide layer 5 and the inner edge of silicide layer 2002 may also be directly in contact with stress liner 11 and/or not covered by sidewall spacer 6. Likewise, Dz (i.e., the portion along the gate sidewall that is not covered by sidewall spacer 6) may be, for instance, at least three percent, or at least fifty percent, or even at least ninety percent, of the total z-direction height of oxide layer 5.

In addition, it can be seen that there is a minimum distance "Dliner" in FIG. 20 between stress liner 11 and a location between gate 3 and silicon body 1. The location between gate 3 and silicon body 1 may be, for example, where the gate dielectric layer 2001 is disposed. Although Dliner may be of any distance, it is preferably small, since the closer stress liner 11 is to gate 3, the more stress that stress liner 11 may apply to gate 3. For example, Dliner may be 25 nm or less, within 15 nm or less, or even 5 nm or less. In fact, the closer stress liner 11 is to gate 3 along the entire length of the sidewalls of gate 3, the more stress that stress liner 11 may apply to gate 3. Accordingly, it may be desirable to configure the device such that stress liner 11 is within 25 nm or less, within 15 nm or less, or even within 5 nm or less, of gate 3 along the entire length of the sidewalls of gate 3.

Figure 14A:
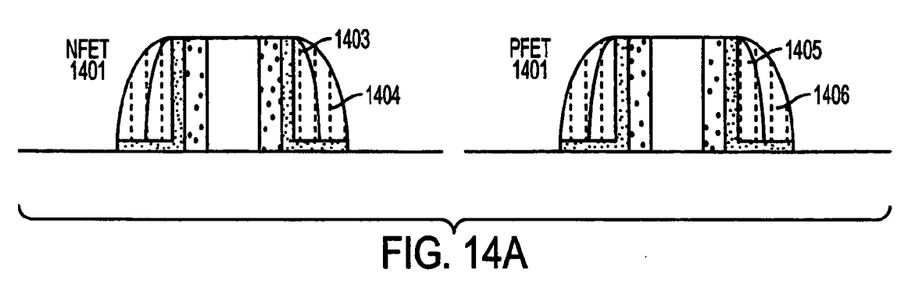
FIG. 14 shows steps that may be taken in producing an illustrative dual-stress liner semiconductor device.
Figure 14B:
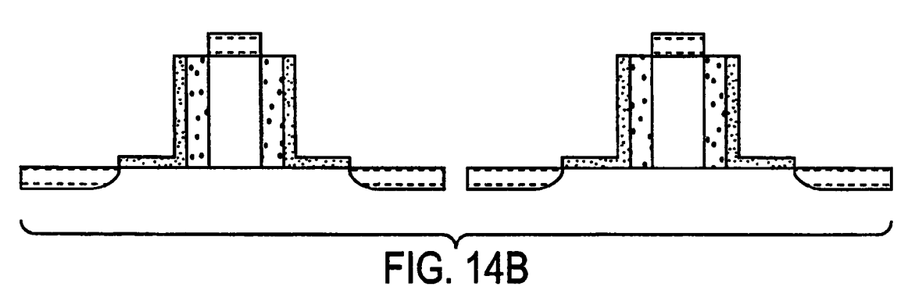
Figure 14C:
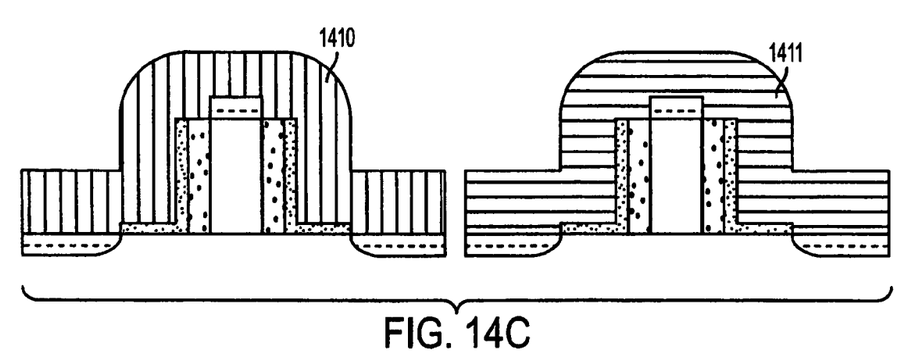

FIG. 14 illustratively shows that the above-described FET devices may also be produced where double sidewall spacers 1403, 1404, 1405, 1406 are used for buffer and source/drain ion implantation in a semiconductor device having both an NFET 1401 and a PFET 1402. As shown, both sets of sidewall spacers 1403-1406 are removed by etching such as in the processes shown in FIGS. 6-9 or 10-13. A dual-stress SiN liner is then deposited using conventional techniques. Dual-stress liner has a tensile portion 1410 over NFET 1401 and a compressive portion 1411 over PFET 1402.

Figure 15A:
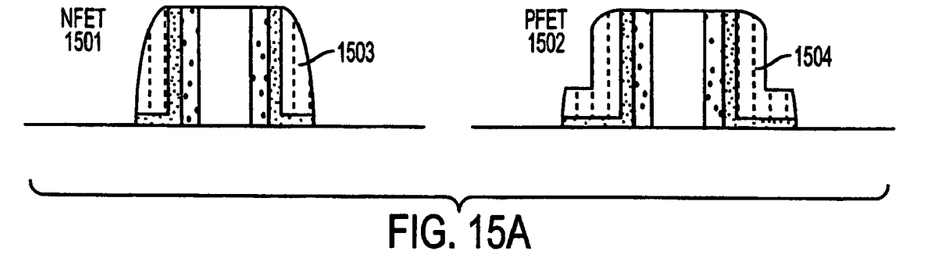
FIG. 15 shows steps that may be taken in producing an illustrative dual-stress liner semiconductor device.
Figure 15B:
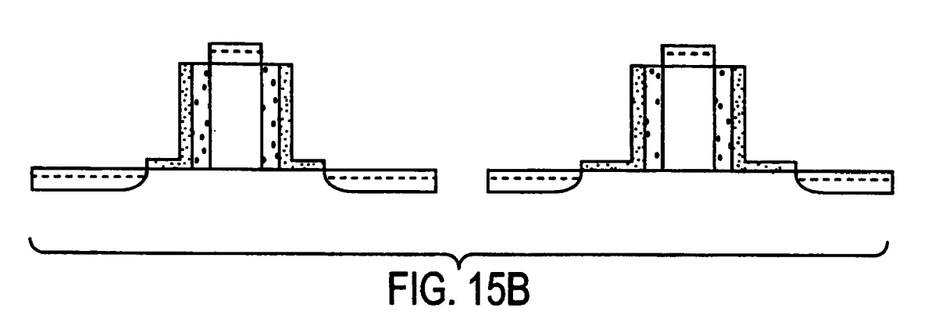
Figure 15C:
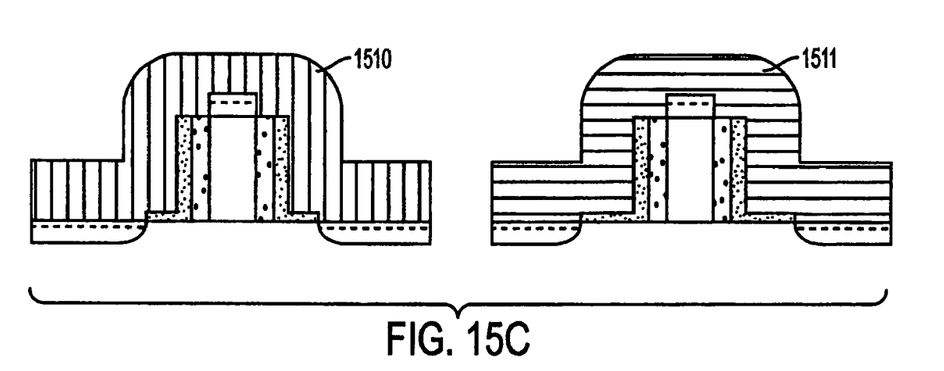

FIG. 15 illustratively shows another possible configuration where sidewall spacers 1503, 1504 may be removed from a semiconductor device having both an NFET 1501 and a PFET 1502. In this example, the distance from the channel to the silicide edge differs between NFET 1501 and PFET 1502. This difference in distance may be desirable where there are differences in the diffusion of implant species between NFET 1501 and PFET 1502 and/or differences in stress applied to NFET 1501 and PFET 1502. A dual-stress SiN liner is then deposited using conventional techniques. Dual-stress liner has a tensile portion 1510 over NFET 1501 and a compressive portion 1511 over PFET 1502.

Figure 16A:
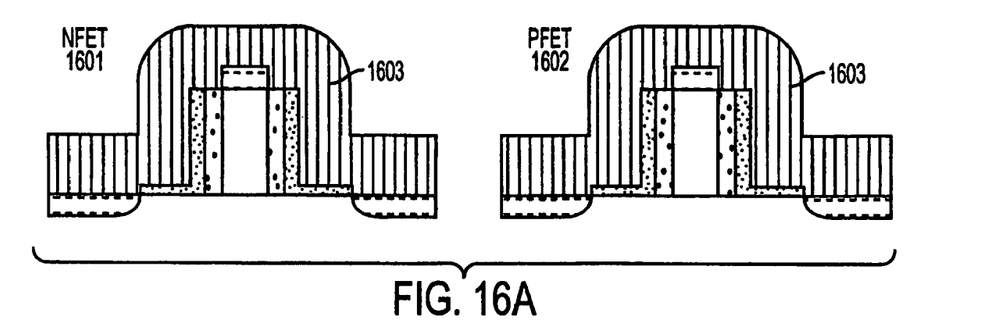
FIG. 16 shows steps that may be taken in producing an illustrative dual-stress liner semiconductor device.
Figure 16B:
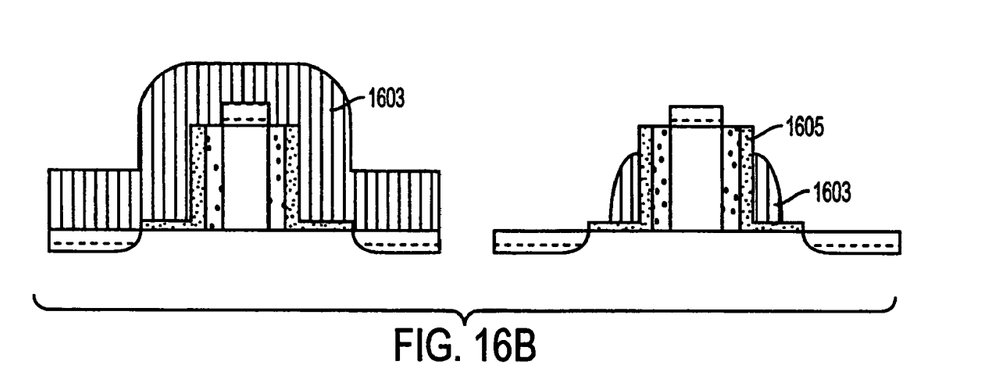
Figure 16C:
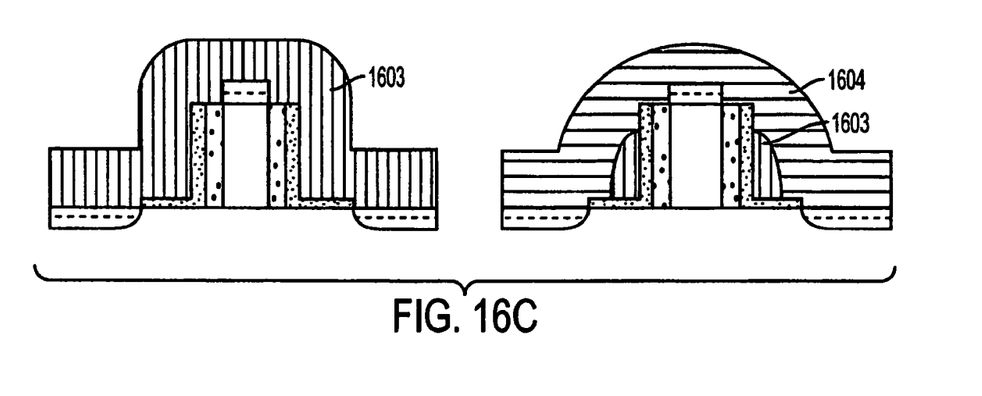

FIG. 16 illustratively shows another embodiment where a dual-stress liner is applied to a semiconductor device having both an NFET 1601 and a PFET 1602. First, a tensile SiN liner 1603 is deposited over the device including both NFET 1601 and PFET 1602. Next, tensile liner 1603 is removed from the area of PFET 1602 while it remains at the area of NFET 1601, using masking techniques. However, a small portion of tensile liner 1603 may remain next to the sidewalls of the gate of PFET 1602. The amount of tensile liner 1603 remaining, if any, may have a shape and/or size that matches the configuration shown in FIG. 20. That is, there may be a distance in the z direction, Dz, as well as a distance in the x direction, Dx, over which an oxide layer 1605 has no disposed tensile liner 1603. Next, using masking techniques, a compressive SiN layer 1604 is added over PFET 1602 but not NFET 1601.

Figure 17A:
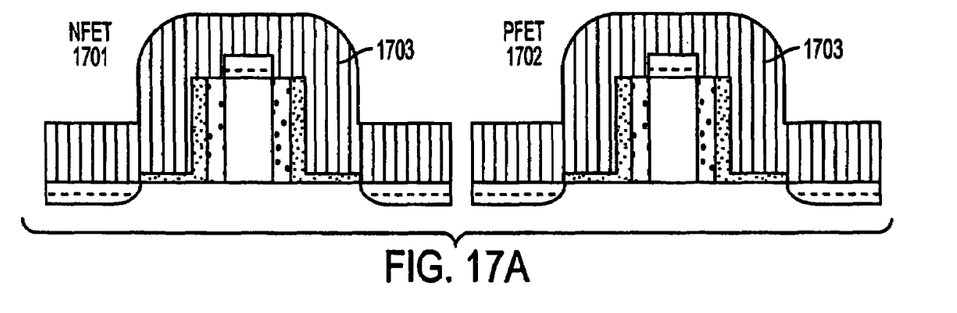
FIGS. 17 and 18 shows steps that may be taken in producing an illustrative dual-stress liner semiconductor device.
Figure 17B:
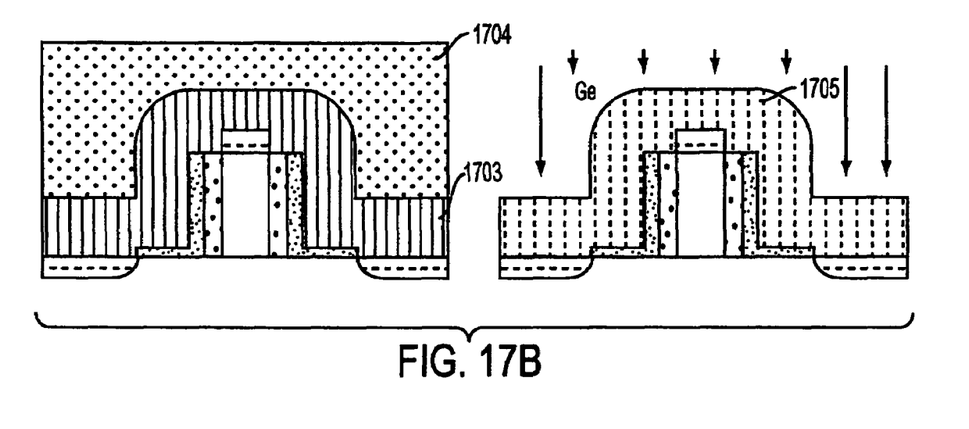
Figure 18A:
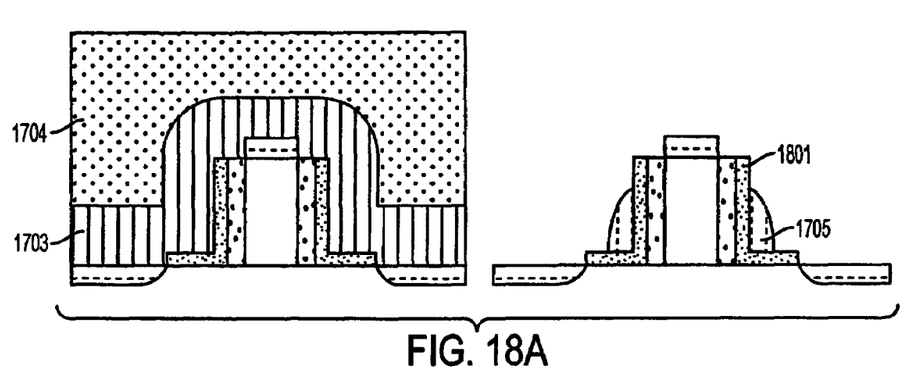
Figure 18B:
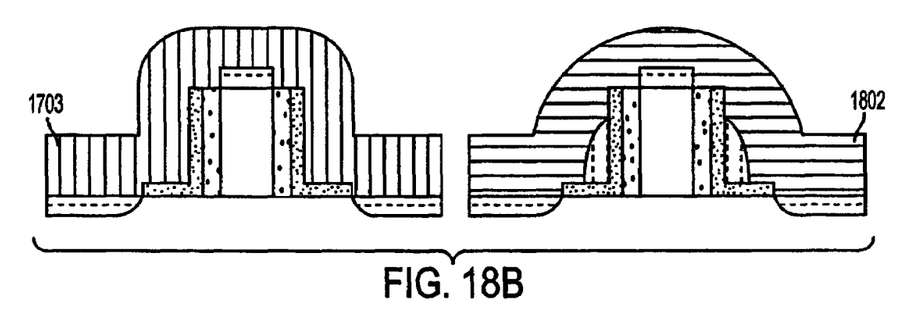

FIG. 17 illustratively shows yet another embodiment where a dual-stress liner is applied to a semiconductor device having both an NFET 1701 and a PFET 1702. first, a tensile SiN liner 1703 is deposited over the device including both NFET 1701 and PFET 1702. Next, germanium (Ge) ions are implanted into compressive liner 1703 over PFET 1702 (but not NFET 1701) using a mask 1704. The result is that the compressive force of compressive liner 1703 is weakened or even neutralized to become a neutralized stress layer 1705. Next, neutralized liner 1705 is removed from the area of PFET 1702, again using mask 1704. However, a small portion of neutralized liner 1705 may remain next to the sidewalls of the gate of PFET 1702. The amount of neutralized liner 1705 remaining, if any, may have a shape and/or size that matches the configuration shown in FIG. 20. That is, there may be a distance in the z direction, Dz, as well as a distance in the x direction, Dx, over which an oxide layer 1801 has no disposed neutralized liner 1705. Next, and again using mask 1704, a compressive SiN layer 1802 is added over PFET 1702 but not NFET 1701.

Figure 19A:
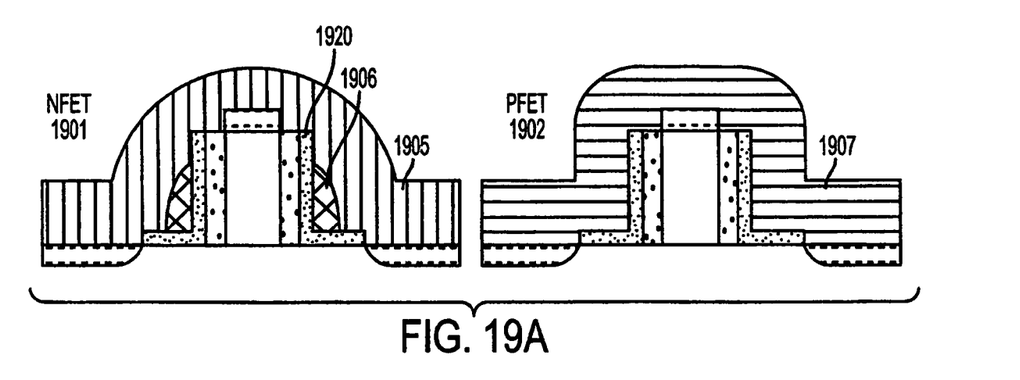
FIG. 19 shows several cross-sectional views of illustrative semiconductor devices with dual-stress liners.
Figure 19B:
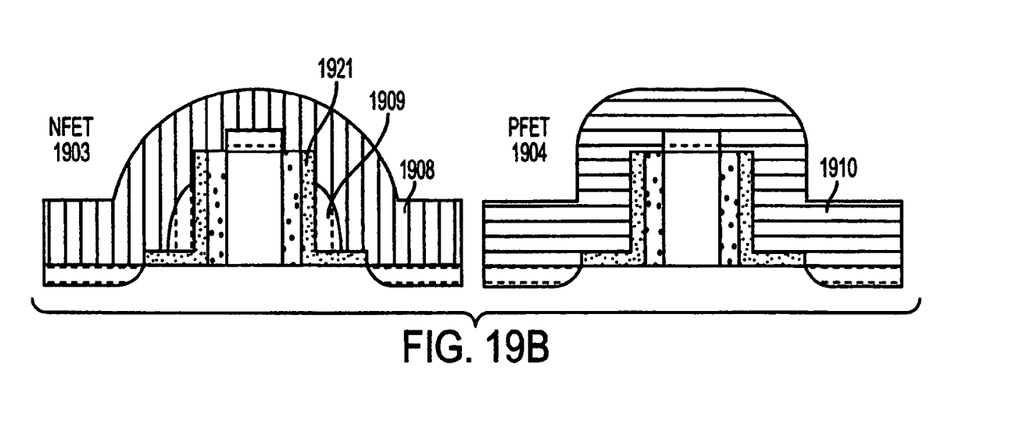

Referring to FIG. 19, two versions of illustrative semiconductor devices are shown, each using a dual-stress liner. The first semiconductor device has an NFET 1901 and a PFET 1902. PFET 1902 has a traditional compressive SiN liner 1907, and NFET 1901 has a tensile SiN liner 1905. However, similar to PFET 1702 in FIG. 18, NFET 1901 also has a liner of a different amount and/or type of stress than liner 1905. In this example, NFET 1901 also has an inner compressive SiN liner 1906 covered by tensile liner 1905. As in several of the previous illustrative embodiments, the inner liner 1906 may have a shape and/or size that matches the configuration shown in FIG. 20. That is, there may be a distance in the z direction, Dz, as well as a distance in the x direction, Dx, over which an oxide layer 1920 has no disposed inner liner 1906.

The second semiconductor device also has an NFET 1903 and a PFET 1904. Again, PFET 1904 has a traditional compressive SiN liner 1910 and NFET 1903 has a tensile SiN liner 1908. As in the first semiconductor device of FIG. 19, NFET 1903 of the second semiconductor device also has a liner of a different amount and/or type of stress than liner 1909. However, in this example, NFET 1903 also has an inner neutralized SiN liner 1909 covered by tensile liner 1908. Again, as in several of the previous illustrative embodiments, the inner liner 1909 may have a shape and/or size that matches the configuration shown in FIG. 20. That is, there may be a distance in the z direction, Dz, as well as a distance in the x direction, Dx, over which an oxide layer 1921 has no disposed inner liner 1909.

Thus, semiconductor devices have been described, as well as methods for manufacturing such devices, wherein stress liners are substantially closer to FET gates than in conventional FETs. It should be noted that although the above-described aspects of the disclosure have been described using SOI embodiments, other technologies may alternatively be used to implement these aspects, such as bulk wafer technologies.

What is claimed is:
1. A semiconductor device, comprising:
a silicon layer;
a first FET that is one of an N-type or a P-type, having a first gate disposed on the silicon layer, the first gate having opposing sidewalls;

a second FET that is the other of an N-type or a P-type, having a second gate disposed on the silicon layer, the second gate having opposing sidewalls;

a first stress liner disposed over the first FET and providing a first stress type to the first gate;

a second stress liner disposed over the second FET and providing a different second stress type to the second gate;

a first oxide layer disposed between each of the sidewalls of the first gate and the first stress liner; and a second oxide layer disposed between each of the sidewalls of the second gate and the second stress liner, wherein the first stress liner is approximately parallel to each of the sidewalls of the first gate along an entire length of each of the sidewalls of the first gate, wherein the second stress liner is not parallel to each of the sidewalls of the second gate along an entire length of each of the sidewalls of the second gate, wherein a first surface of each of the first oxide layers facing away from the first gate is in physical contact with the first stress liner over the entirety of the first surface, and wherein a second surface of each of the second oxide layers facing away from the second gate is in physical contact with the second stress liner over only a portion of the second surface.

2. The semiconductor device of claim 1, further including a silicon nitride layer disposed between each of the second oxide layers and the second stress liner, the silicon nitride layer providing a different amount of stress than the second stress liner.

3. The semiconductor device of claim 2, wherein the first FET is a NFET and the second FET is a PFET, and wherein the silicon nitride layer is a tensile stress layer.

4. The semiconductor device of claim 2, wherein the first FET is a NFET and the second FET is a PFET, and wherein the silicon nitride layer is a neutral stress layer.

5. The semiconductor device of claim 2, wherein the first FET is a PFET and the second FET is a NFET, and wherein the silicon nitride layer is a compressive stress layer.

6. The semiconductor device of claim 2, wherein the first FET is a PFET and the second FET is a NFET, and wherein the silicon nitride layer is a neutral stress layer.

7. The semiconductor device of claim 1, wherein each of the first oxide layers is L-shaped.

8. The semiconductor device of claim 1, wherein the first stress liner is within 15 nanometers of a location between the first gate and the silicon layer, and the second stress liner is within 15 nanometers of a location between the second gate and the silicon layer.

9. The semiconductor device of claim 1, wherein the first stress liner is within 25 nanometers of each of the sidewalls of the first gate along the entire length of each of the sidewalls of the first gate, and the second stress liner is within 25 nanometers of each of the sidewalls of the second gate along the entire length of each of the sidewalls of the second gate.

10. The semiconductor device of claim 1, further including a first gate dielectric layer disposed between the first gate and the silicon layer, and a second gate dielectric layer disposed between the second gate and the silicon layer.

11. The semiconductor device of claim 10, wherein the first stress liner is within 15 nanometers of the first gate dielectric layer, and the second stress liner is within 15 nanometers of the second gate dielectric layer.

12. The semiconductor device of claim 1, wherein the silicon layer is a substrate of the semiconductor device.

13. The semiconductor device of claim 1, wherein the silicon layer is disposed on a third oxide layer, and wherein the third oxide layer is further disposed on a substrate.

14. A semiconductor device, comprising:

a silicon layer;

a gate disposed on the silicon layer;

a pair of source/drain regions disposed in the silicon layer on opposing sides of the gate and each spaced laterally from a respective sidewall of the gate by a first distance; and a stress liner disposed on the sidewalls of the gate and the silicon layer, wherein the stress liner is laterally closer to each of the sidewalls of the gate than the first distance by at least 10 nanometers.

15. The semiconductor device of claim 14, further including a pair of silicide regions disposed in the silicon layer on opposing sides of the gate and each spaced laterally from a respective sidewall of the gate by a second distance, wherein the second distance is longer than the lateral distance between the stress liner and the sidewalls.

16. The semiconductor device of claim 14, further comprising an L-shaped oxide layer disposed on each of the sidewalls of the gate and on the silicon layer, and wherein the stress liner is physically in contact with the oxide layers.

17. The semiconductor device of claim 16, wherein the stress liner is within 25 nanometers of each of the sidewalls of the gate along an entire length of each of the sidewalls of the gate.

18. The semiconductor device of claim 14, further comprising a gate dielectric layer disposed between the gate and the silicon layer.

19. The semiconductor device of claim 18, wherein the stress liner is within 15 nanometers of the gate dielectric layer.

20. The semiconductor device of claim 14, wherein the silicon layer is disposed on an oxide layer, and wherein the oxide layer is further disposed on a substrate.

* * * * *

UNITED STATES PATENT AND TRADEMARK OFFICE
CERTIFICATE OF CORRECTION

PATENT NO. : 7,569,888 B2
APPLICATION NO. : 11/200168
DATED : August 4, 2009
INVENTOR(S) : Gaku Sudo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 927 days.

Signed and Sealed this

Seventh Day of September, 2010

David J. Kappos
*Director of the United States Patent and Trademark Office*